United States Patent
Wu

(10) Patent No.: US 10,825,706 B2
(45) Date of Patent: Nov. 3, 2020

(54) METHOD AND DEVICE OF BATCH TRANSFERRING MICRO COMPONENTS

(71) Applicant: INNOSERV, INC., Taichung (TW)

(72) Inventor: Chih-Meng Wu, Taichung (TW)

(73) Assignee: Innostar service Inc., Taichung (TW)

( * ) Notice: Subject to any disclaimer, the term of this patent is extended or adjusted under 35 U.S.C. 154(b) by 237 days.

(21) Appl. No.: 15/965,920

(22) Filed: Apr. 28, 2018

(65) Prior Publication Data

US 2019/0035662 A1 Jan. 31, 2019

(30) Foreign Application Priority Data

Jul. 28, 2017 (TW) ............................. 106125563 A

(51) Int. Cl.
*H01L 21/677* (2006.01)
*H01L 21/683* (2006.01)
(Continued)

(52) U.S. Cl.
CPC .. *H01L 21/67754* (2013.01); *H01L 21/67144* (2013.01); *H01L 21/6835* (2013.01);
(Continued)

(58) Field of Classification Search
CPC ............... H01L 21/67754; H01L 24/95; H01L 21/67144; H01L 21/6835; H01L 21/6836; H01L 2221/68322; H01L 21/67248; H01L 33/0095; H01L 2221/68354; H01L 21/67109; H01L 2221/68363; H01L 2224/7531; H01L 2224/8385; H01L 2224/75502; H01L 2224/95; H01L 24/75; H01L 2224/32105; H01L 2224/32225; H01L 2224/75303; H01L 24/32; H01L 24/83; H01L 24/29; H01L 24/27; H01L 2224/2731; H01L 2224/2919;
(Continued)

(56) References Cited

U.S. PATENT DOCUMENTS

| 4,724,030 A * | 2/1988 | Kurtz ........................ C09J 5/06 156/307.3 |
| 2016/0266345 A1* | 9/2016 | Li ........................... G02B 7/003 |

OTHER PUBLICATIONS

Max-Planck-Gesellschaft, "Switch and stick: Potential new adhesive can be turned on and off", Science Daily, May 19, 2016, www.sciencedaily.com/releases/2016/05/160519100713.htm. (Year: 2016).*

* cited by examiner

*Primary Examiner* — Michael N Orlando
*Assistant Examiner* — Christopher W Raimund

(57) ABSTRACT

A method of batch transferring micro components comprising steps of: A. arranging multiple probes in array on a carrying unit and extending multiple columns of the multiple probes out of a bottom of the carrying unit; B. providing a temperature control conduit in the carrying unit into which hot water is fed; C. driving the carrying unit so that the multiple columns of the multiple probes dip an adhesive material; D. feeding cold water into the temperature control conduit; E. moving the carrying unit on micro components and pressing the multiple probes of the carrying unit downward; F. moving the carrying unit onto a substrate and pressing the micro components to desired positions respectively; and G. heating adhesive material again as pressing the micro components and controlling the substrate at a low temperature so that the adhesive material freezes among the micro components and the substrate.

10 Claims, 7 Drawing Sheets

(51) Int. Cl.
*H01L 23/00* (2006.01)
*H01L 21/67* (2006.01)
*H01L 33/00* (2010.01)

(52) U.S. Cl.
CPC .......... *H01L 21/6836* (2013.01); *H01L 24/95* (2013.01); *H01L 21/67109* (2013.01); *H01L 21/67248* (2013.01); *H01L 33/0095* (2013.01); *H01L 2221/68322* (2013.01); *H01L 2221/68354* (2013.01); *H01L 2221/68363* (2013.01)

(58) Field of Classification Search
CPC ..... H01L 2224/75252; H01L 2224/756; H01L 24/743; H01L 2924/12041; H01L 2224/7598
See application file for complete search history.

METHOD AND DEVICE OF BATCH TRANSFERRING MICRO COMPONENTS

BACKGROUND OF THE INVENTION

1. Technical Field

The present invention relates to a method of mass transferring micro components, and more particularly to a method and a device of batch transferring the micro components.

2. Description of Related Art

With maturation and evolution of light-emitting diodes (LEDs), the LEDs are laminated, miniaturized, arrayed nowadays, for example, a size of each LED is miniaturized within 1 μm to 10 μm so as to produce micro LED display.

The micro LED has more specifications than LCD and the same image quality as OLED, but it has defects as follows:

1. Regarding die bonding to an LED light bar, defective pixel occurs on the LED light bar, so it is difficult to embody millions of micro LEDs onto a display. To overcome such a problem, LCD and OLED are produce in batch so as to enhance production yield.

2. It is suitable to flip chip LEDs on a micro LED display because of small size and easy production, thus miniaturizing micro LEDs without metal wires, and decreasing a distance between any two adjacent LEDs. It is to be noted that flip chip is improved with development of LED.

3. It is difficult to batch transfer micro LEDs, such as RGB LEDs. But it is easy to transfer micro LEDs in mass production with improvement of adhering and printing LEDs.

To adhesion and printing technology of micro LEDs, Surface Mount Technology (SMT) or Chip on Board (COB) are qualified, for example, micro LED chips are bonded onto a substrate, yet it is time-consuming and cause slow production speed and efficiency.

The present invention has arisen to mitigate and/or obviate the afore-described disadvantages.

SUMMARY OF THE INVENTION

The primary aspect of the present invention is to provide a method and a device of batch transferring micro components which heat and cool the temperature control conduit of the carrying unit so as to dip and freeze the adhesive material and to transfer the micro components after cooling the adhesive material, and the adhesive material is heated and melt so that the micro components are transferred onto the substrate, thus transferring the micro components (such as micro LEDs) stably, accelerating production speed, and enhancing production quantity.

Another aspect of the present invention is to provide a method and a device of batch transferring micro components which engage each probe with each micro component by using at least one first and second connection portion so as to transfer each micro component stably.

To obtain above-mentioned aspects, a method of batch transferring micro components contains steps of:

A arranging multiple probes in array on a carrying unit, and extending multiple columns of the multiple probes out of a bottom of the carrying unit;

B. providing a temperature control conduit in the carrying unit into which hot water is fed so as to heat the multiple probes;

C. driving the carrying unit so that the multiple columns of the multiple probes dip an adhesive material;

D. feeding cold water into the temperature control conduit so as to drop temperature of the multiple probes, hence the adhesive material adheres on the multiple columns of the multiple probes;

E. moving the carrying unit on micro components and pressing the multiple probes of the carrying unit downward so that the adhesive material batch dips with the micro components;

F. moving the carrying unit onto a substrate and aligning and pressing the micro components to desired positions respectively; and G. heating the adhesive material again as pressing the micro components so that the adhesive material melts and flows onto the substrate, and controlling the substrate at a low temperature so that the adhesive material freezes among the micro components and the substrate, thus batch transferring the micro components.

Accordingly, the adhesive material dips with the micro components, is cooled in a temperature controlling manner, and is heated so as to melt the adhesive material and to transfer the micro components (such as micro LEDs), thus accelerating production speed, enhancing production quantity, and reducing fabrication cost.

DETAILED DESCRIPTION OF THE
PREFERRED EMBODIMENTS

Figure 1:
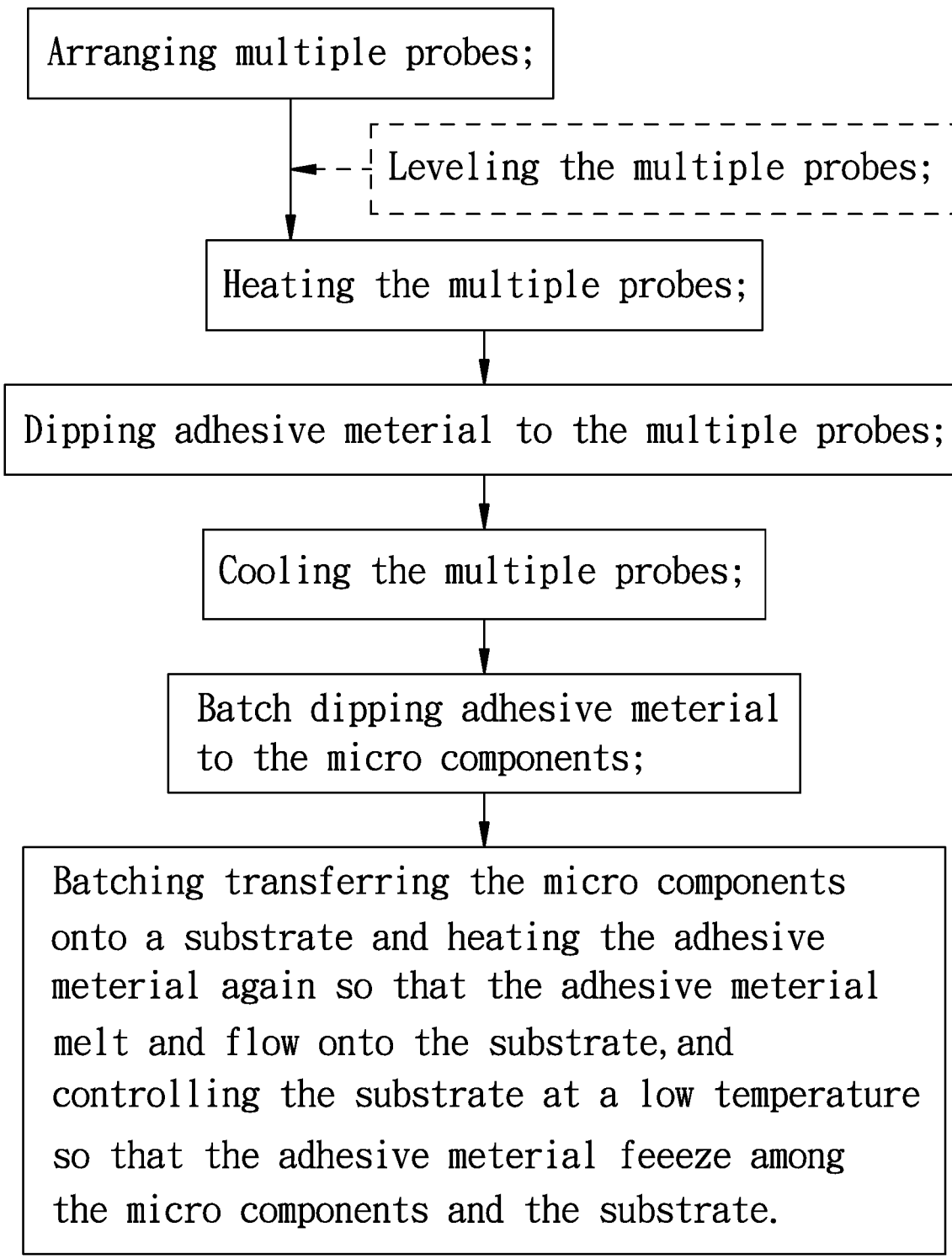
FIG. 1 is a flow chart of a method of batch transferring micro components according to the present invention.
Figure 2:
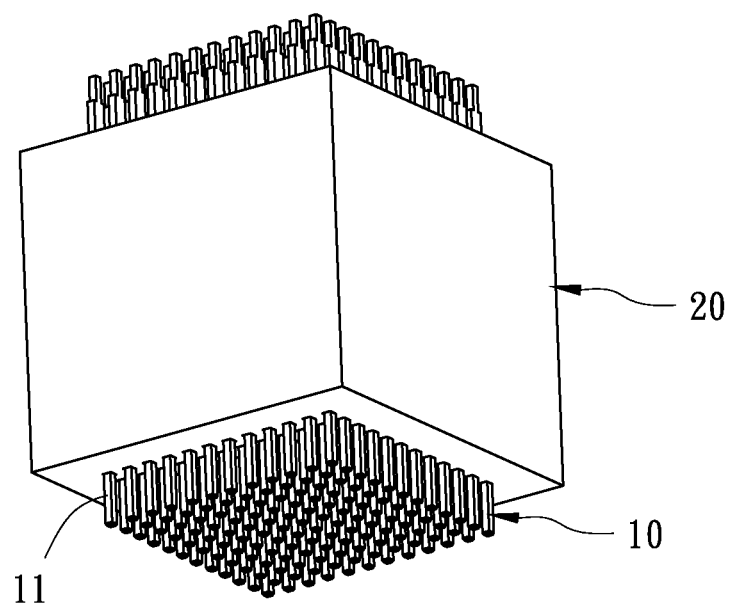
FIG. 2 is a perspective view showing a method and a device of batch transferring the micro components according to the present invention.
Figure 3:
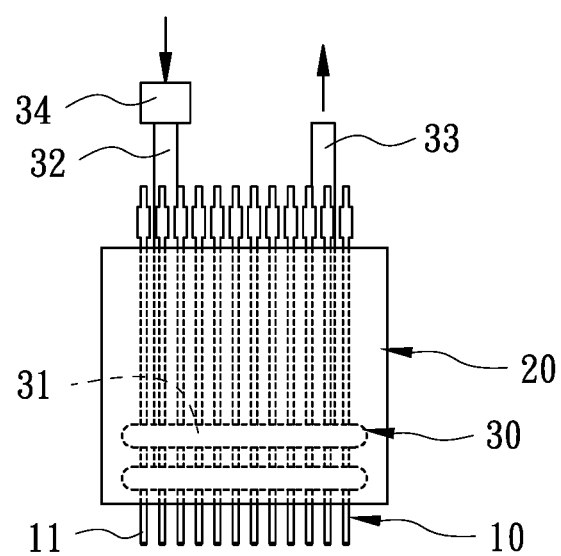
FIG. 3 is a side plane view showing the method and the device of batch transferring the micro components according to the present invention.
Figure 4:
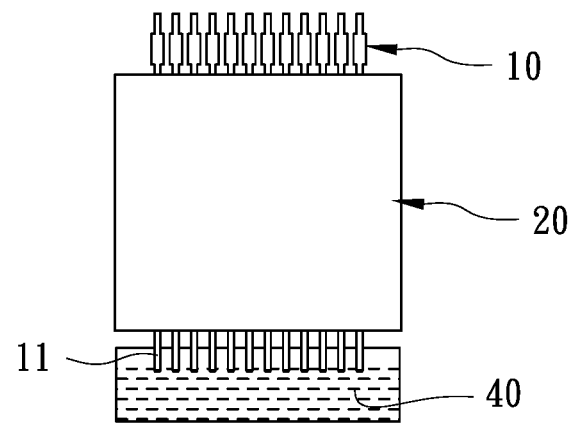
FIG. 4 is a side plane view showing each probe dipping an adhesive material according to the present invention.
Figure 5:
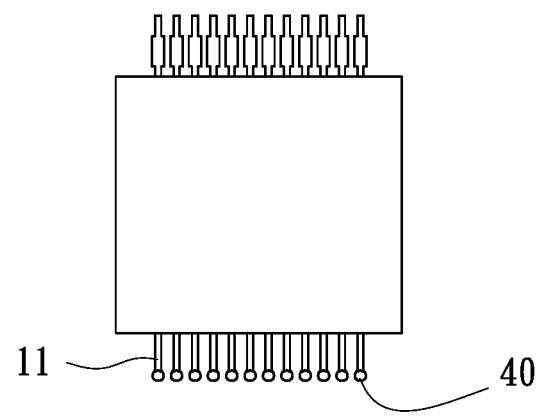
FIG. 5 is another side plane view showing each probe dipping the adhesive material according to the present invention.

With reference to FIGS. 1 and 2, a method of batch transferring micro components according to a preferred embodiment of the present invention comprises steps of:

A. arranging multiple probes 10 in array on a carrying unit 20, and extending multiple columns 11 of the multiple probes 10 out of a bottom of the carrying unit 20, as shown in FIG. 2, and leveling the multiple probes 10 on the carrying unit 20 so that the multiple columns 11 flush with one another on the bottom of the carrying unit 20, wherein the multiple probes 10 are leveled in a grinding manner based on a required execution frequency;

B. heating the multiple probes 10 by feeding hot water into a temperature control conduit 30 in the carrying unit 20, as illustrated in FIG. 3, wherein the temperature control conduit 30 is defined by a winding channel 31 around the multiple probes 10, an inlet segment 32 and an outlet segment 33 of the winding channel 31 extend out of a top of the carrying unit 20, and the hot water flows through the winding channel 31 so as to heat the multiple probes 10, wherein a temperature of the hot water of the winding channel 31 is within 50° C. to 140° C.;

C. driving the carrying unit 20, as shown in FIG. 4, so that the multiple columns 11 of the multiple probes 10 dip an adhesive material 40, as shown in FIG. 5, wherein the adhesive material 40 is any one of flux, glue, and underfill. In this embodiment, the adhesive material 40 is flux.

The method of batch transferring micro components further comprises step of:

D. feeding cold water into the temperature control conduit 30 so as to drop temperature of the multiple probes 10, hence the adhesive material 40 freezes on the multiple columns 11 of the multiple probes 10 so as to enhance adhesion. Referring to FIG. 3, the temperature control conduit 30 includes a control valve 34 disposed on the inlet segment 32 so as to flow the cold water into the winding channel 31 after shifting the control valve 34, thus reducing the temperature of the multiple probes 10. In this embodiment, a temperature of the cold water of the winding channel 31 is within 0° C. to 30° C.

Figure 6:
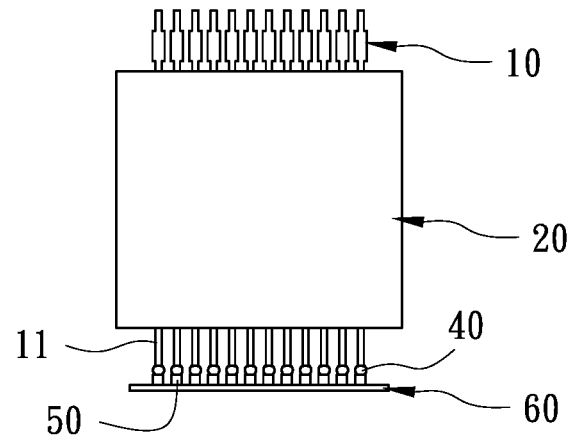
FIG. 6 is a side plane view showing each micro component being moved onto a platform, wherein each probe contacts with each micro component after dipping the adhesive material according to the present invention.
Figure 7:
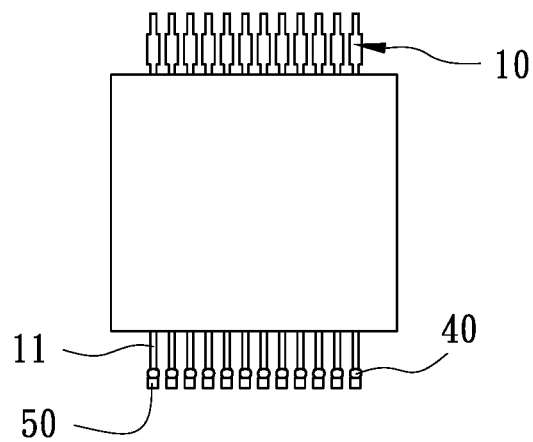
FIG. 7 is a side plane view showing each micro component adhering on each column according to the present invention.
Figure 8:
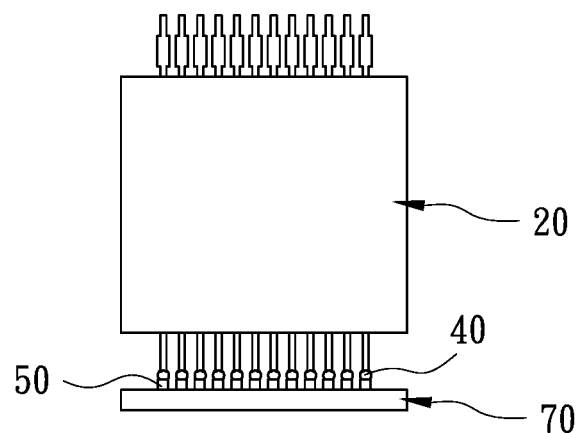
FIG. 8 is a side plane view showing each micro component being moved onto a substrate according to the present invention.
Figure 9:
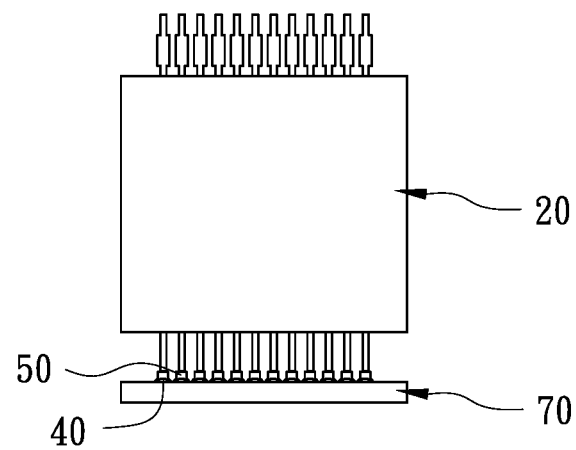
FIG. 9 is a side plan view showing each micro component being batch transferred onto the substrate after the adhesive material flowing into the substrate according to the present invention.

The method of batch transferring micro components further comprises step of:

E. moving the carrying unit 20 on the micro components 50, as shown in FIG. 6, and pressing the multiple probes 10 of the carrying unit 20 downward so that the adhesive material 40 batch dips with the micro components 50. In the step E, the micro components 50 peel off from a blue tape and expand to a target distance, and the micro components 50 are moved onto a platform 60, hence after the adhesive material 40 dips with the micro components 50, the carrying unit 20 lifts, and the micro components 50 are removed upward from the platform 60, as shown in FIG. 7;

F. moving the carrying unit 20 onto a substrate 70, as shown in FIG. 8, and heating the adhesive material 40 (in the same heating manner as the step B) so that the adhesive material 40 flows onto the substrate 70 after melting, and the substrate 70 is controlled at a low temperature so that the adhesive material 40 is cooled among the micro components 50 and the substrate 70, thus transferring the micro components 50, as illustrated in FIG. 9.

Figure 10:
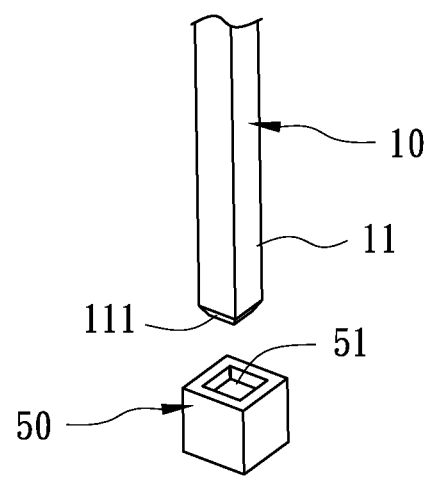
FIG. 10 is a perspective view showing each probe being engaged with each micro component according to the present invention.

Referring to FIG. 10, each of the multiple columns 11 of each probe 10 has a first connection portion 111 formed on a bottom thereof, and each of the micro components 50 has at least one second connection portion 51 formed on a top thereof so as to retain with the first connection portion 111 of each column 11, hence each probe 10 temporarily retains with each micro component 50 in the step E so as to fix each micro component 50 when each micro component 50 is transferred, and each probe 10 picks each micro component 50 securely.

Figure 11:
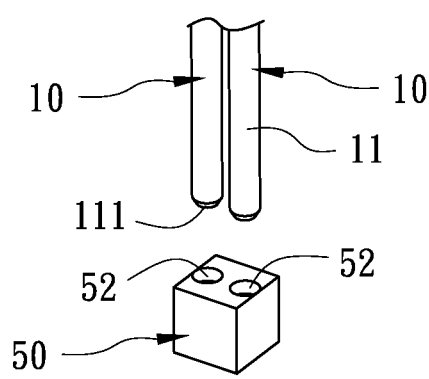
FIG. 11 is a perspective view showing multiple probes being engaged with each micro component according to the present invention.

With reference to FIGS. 2-10, the multiple probes 10 and the multiple micro components 50 are batch transferred, and each probe 10 corresponds to each micro component 50, for example, the at least one second connection portion 51 of each micro component 50 retains with the first connection portion 111 of each column 11. In another embodiment, each probe 10 engages with each micro component 50 by using multiple first connection portions 111 and a second connection portion 52 or by using a first connection portion 111 and multiple second connection portions 52. Furthermore, the multiple probes 10 engage with each micro component 50 by using multiple first connection portions 111 and multiple second connection portions 52 respectively. As illustrated in FIG. 11, two probes 10 engage with each micro component 50 by using two first connection portions 111 of two columns 11 and two second connection portions 52 of each micro component 50, hence the two probes 10 pick each micro component 50 securely.

As shown in FIG. 10, the first connection portion 111 of each column 11 of each probe 10 is in a truncated square pyramid shape, and the at least one second connection portion 51 of each micro component 50 is rectangular. Preferably, each of the first connection portion 111 and the at least one second connection portion 51, 52 is in any one of cone, polygon, circle, and arc shapes so that each probe 10 engages with each micro component 50.

Figure 12:
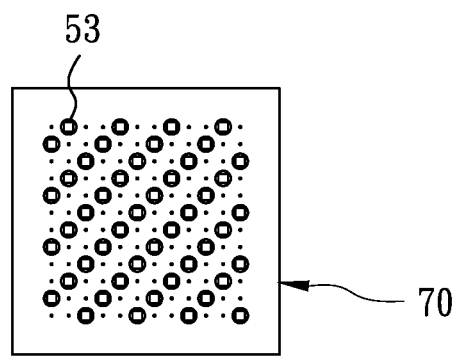
FIG. 12 is a top plan view showing R micro LEDs being transferred onto the substrate according to the present invention.
Figure 13:
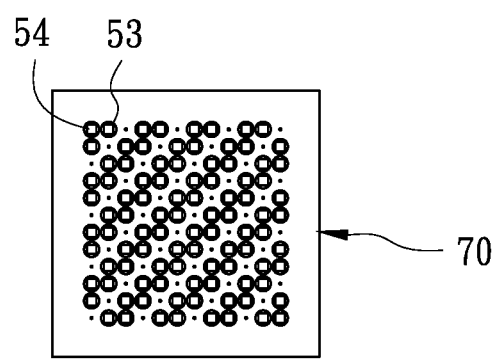
FIG. 13 is a top plan view showing R and G micro LEDs being transferred onto the substrate according to the present invention.
Figure 14:
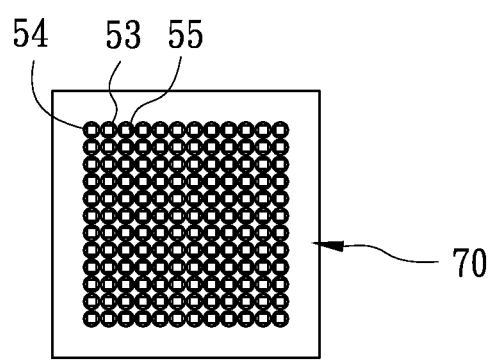
FIG. 14 is a top plan view showing R, G and B micro LEDs being transferred onto the substrate according to the present invention.

With reference to FIGS. 12-14, in a batch transfer processing, the multiple micro components are red (R) micro light-emitting diodes (LEDs), green (G) micro light-emitting diodes (LEDs), and blue (B) micro light-emitting diodes (LEDs) which are transferred by at least one transfer unit, hence the R micro LEDs 53, the G micro LEDs 54, and the B micro LEDs 55 are batch adhered and are printing packaged so that the R micro LEDs 53, the G micro LEDs 54, and the B micro LEDs 55 are batch transferred onto the substrate 70 quickly.

Figure 15:
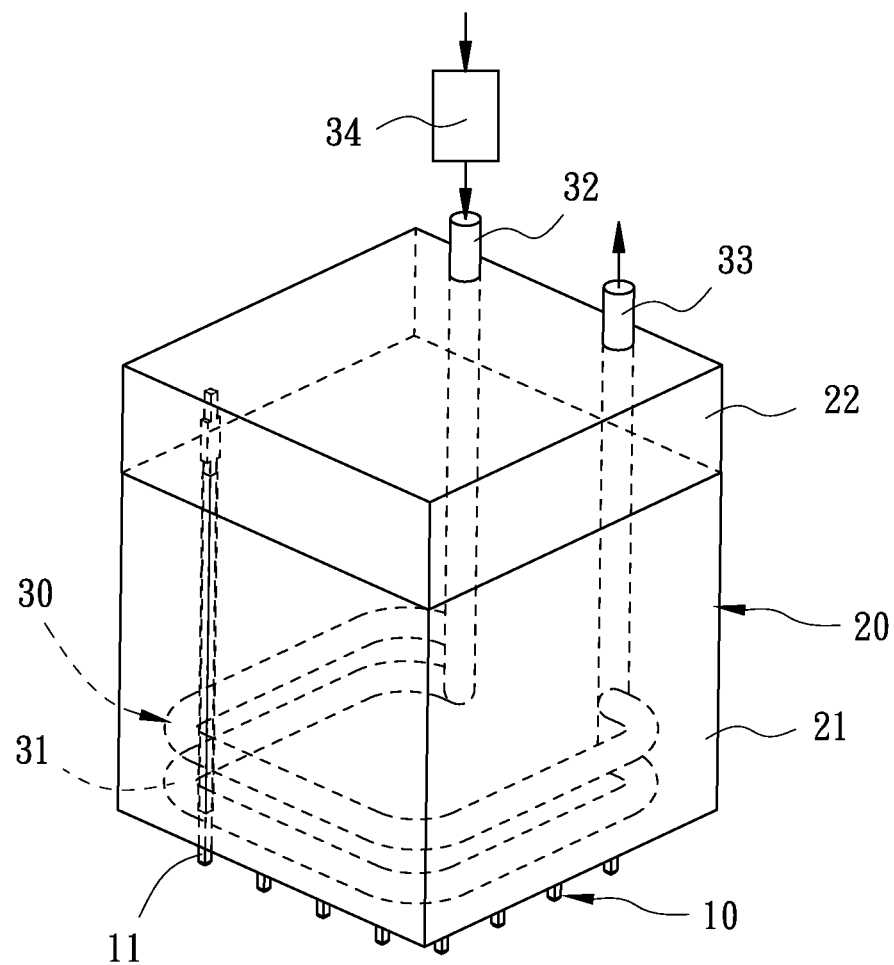
FIG. 15 is a perspective view showing the assembly of a transferring device according to the present invention.

Referring to FIG. 15, the R micro LEDs 53, the G micro LEDs 54, and the B micro LEDs 55 are batch transferred by a transferring device which comprises a carrying unit 20, multiple probes 10, and a temperature control conduit 30.

The carrying unit 20 includes a transfer head 21 and a cap 22 located on the transfer head 21.

The multiple probes 10 are arranged in array on and pass through the transfer head 21, and the multiple first connection portions 111 of the multiple columns 11 extend out of a bottom of the transfer head 21. The multiple columns 11 of the multiple probes 10 are in any one of cone, polygon, circle, and arc shapes.

The temperature control conduit 30 is formed on the carrying unit 20 and includes a winding channel 31 arranged around the multiple probes 10, the inlet segment 32 and the outlet segment 33 of the winding channel 31 extend out of a top of the cap 22 of the carrying unit 20, and the temperature control conduit 30 includes a control valve 34 disposed on the inlet segment 32 thereof so as to flow the hot water or the cold water into the winding channel 31 after shifting the control valve 34, thus reducing the temperature of the multiple probes 10.

To overcome slow production speed and low production quantity of the micro LEDs by using surface mount technology (SMT) or chip on board (COB), the temperature control conduit 30 of the carrying unit 20 heats the multiple probes 10 so that the multiple columns 11 dips the adhesive material 40, wherein a dose of dipping is controlled by controlling a heating temperature to the multiple probes 10, and a temperature of the temperature control conduit 30 is reduced so that the adhesive material 40 freezes on the multiple columns 11 of the multiple probes 10. The carrying unit 20 is moved to each micro component 50 and presses downward so that the adhesive material 40 dips each micro component 50, and each micro component 50 is lifted upward from the platform 60 and is moved to the substrate 70, then the winding channel 31 is controlled to heat the adhesive material 40 of the multiple columns 11 so that the adhesive material 40 melts and flows onto the substrate 70, and the substrate 70 is cooled, hence the adhesive material 40 freezes among the micro components 50 and the substrate 70 so as to adhere the micro components 50 on the substrate 70, thus batch transferring the micro components 50. Accordingly, the adhesive material 40 dips with the micro components 50, is cooled in a temperature controlling manner, and is heated so as to melt and to transfer the micro components 50 (i.e., the micro LEDs) onto the substrate 70 quickly and securely, thus accelerating production speed, enhancing production quantity, and reducing fabrication cost. Preferably, the multiple columns 11 engage with the micro components 50 by using the multiple first connection portions 111 and the second connection portion 52 or by using the first connection portion 111 and multiple second connection portions 52, thus transferring the micro components 50 stably.

As shown in FIGS. 2-15, the micro components are electronic components, such as micro LEDs. It is to be noted that the micro components are a variety of gemstones in another embodiment.

While the preferred embodiments of the invention have been set forth for the purpose of disclosure, modifications of the disclosed embodiments of the invention as well as other embodiments thereof may occur to those skilled in the art. Accordingly, the appended claims are intended to cover all embodiments which do not depart from the spirit and scope of the invention.

What is claimed is:

1. A method of batch transferring micro components comprising steps of:
    A. arranging multiple probes in array on a carrying unit, and extending multiple columns of the multiple probes out of a bottom of the carrying unit;
    B. providing a temperature control conduit in the carrying unit into which hot water is fed so as to heat the multiple probes;
    C. driving the carrying unit so that the multiple columns of the multiple probes dip an adhesive material;
    D. feeding cold water into the temperature control conduit so as to drop temperature of the multiple probes, hence the adhesive material adheres on the multiple columns of the multiple probes;
    E. moving the carrying unit on micro components and pressing the multiple probes of the carrying unit downward so that the adhesive material contacts the micro components;
    F. moving the carrying unit onto a substrate and aligning and pressing the micro components to desired positions respectively; and
    G. heating the adhesive material again as pressing the micro components so that the adhesive material melts and flows onto the substrate, and controlling the substrate at a low temperature so that the adhesive material freezes among the micro components and the substrate, thus batch transferring the micro components.

2. The method as claimed in claim 1, wherein in the step B, the temperature control conduit is defined by a winding channel around the multiple probes, and an inlet segment and an outlet segment of the winding channel extend out of a top of the carrying unit, and the hot water flows through the winding channel so as to heat the multiple probes.

3. The method as claimed in claim 1, wherein in the step D, the temperature control conduit includes a winding channel arranged around the multiple probes, an inlet segment and an outlet segment of the winding channel extend of a top of the carrying unit, and the temperature control conduit includes a control valve disposed on the inlet segment thereof so as to flow the cold water into the winding channel, thus reducing a temperature of the multiple probes.

4. The method as claimed in claim 1, wherein in the step E, the micro components are moved and arranged onto a platform at a predetermined distance, hence after the adhesive material on the multiple columns contacts the micro components, the carrying unit lifts, and the micro components are removed upward from the platform.

5. The method as claimed in claim 1, wherein in the step E, each probe has a first connection portion formed on a bottom thereof, and each of the micro components has at least one second connection portion formed on a top thereof so as to retain the first connection portion of each probe, hence each probe temporarily retains each micro component.

6. The method as claimed in claim 2, wherein in the step B, a temperature of the hot water of the winding channel is within 50° C. to 140° C.

7. The method as claimed in claim 2, wherein in the step D, a temperature of the cold water of the winding channel is within 0° C. to 30° C.

8. The method as claimed in claim 1, wherein after the step A, leveling the multiple probes on the carrying unit so that the multiple columns of the multiple probes are flushed with one another.

9. The method as claimed in claim 1, wherein in the step C, the adhesive material is any one of flux, glue, and underfill.

10. The method as claimed in claim 1, wherein in the step E, a first connection portion of each probe and at least one second connection portion of each micro component are in any one of cone, polygon, circle, and arc shapes.

* * * * *